US008703567B2

(12) United States Patent
Wang et al.

(10) Patent No.: US 8,703,567 B2

(45) Date of Patent: Apr. 22, 2014

(54) METHOD FOR MANUFACTURING A SEMICONDUCTOR DEVICE

(75) Inventors: Guilei Wang, Beijing (CN); Chunlong Li, Beijing (CN); Chao Zhao, Kessel-lo (BE)

(73) Assignee: The Institute of Microelectronics Chinese Academy of Science, Beijing (CN)

(*) Notice: Subject to any disclaimer, the term of this patent is extended or adjusted under 35 U.S.C. 154(b) by 1 day.

(21) Appl. No.: 13/497,744

(22) PCT Filed: Nov. 29, 2011

(86) PCT No.: PCT/CN2011/001994

§ 371 (c)(1), (2), (4) Date: Mar. 22, 2012

(87) PCT Pub. No.: WO2012/174696

PCT Pub. Date: Dec. 27, 2012

(65) Prior Publication Data

US 2012/0319215 A1 Dec. 20, 2012

(30) Foreign Application Priority Data

Jun. 20, 2011 (CN) .......................... 2011 1 0165241
Nov. 29, 2011 (WO) ................ PCT/CN2011/001994

(51) Int. Cl.
*H01L 21/336* (2006.01)

(52) U.S. Cl.
USPC ........... 438/287; 438/285; 438/299; 438/584; 438/766; 257/288; 257/348; 257/410

(58) Field of Classification Search
USPC ......... 438/161–166, 151, 285–287, 299, 584, 438/766, 778; 257/288, 255, 410, 348, 506, 257/192

See application file for complete search history.

(56) References Cited

U.S. PATENT DOCUMENTS

2009/0212329 A1* 8/2009 Ieong et al. .................. 257/255
2009/0294809 A1* 12/2009 Frohberg et al. ............. 257/288

* cited by examiner

*Primary Examiner* — Dung A. Le

(74) *Attorney, Agent, or Firm* — Treasure IP Group

(57) ABSTRACT

The present invention discloses a method for manufacturing a semiconductor device, comprising: forming an insulating isolation layer on a substrate; forming an insulating isolation layer trench in the insulating isolation layer; forming an active region layer in the insulating isolation layer trench; forming a semiconductor device structure in and above the active region layer; characterized in that the carrier mobility of the active region layer is higher than that of the substrate. Said active region is formed of a material different from that of the substrate, the carrier mobility in the channel region is enhanced, thereby the device response speed is improved and the device performance is enhanced. Unlike the existing STI manufacturing process, for the present invention, an STI is formed first, and then filling is performed to form an active region, thus avoiding the problem of generation of holes in STI, and improving the device reliability.

13 Claims, 3 Drawing Sheets

62 63 63 65 61 65 30 64 64 30 20 50 20 10

30 64 65 63 62 63 65 64 30

METHOD FOR MANUFACTURING A SEMICONDUCTOR DEVICE

CROSS REFERENCE TO RELATED APPLICATION

This application is a National Phase application of, and claims priority to, PCT Application No. PCT/CN2011/001994, filed on Nov. 29, 2011, entitled 'SEMICONDUCTOR DEVICE AND METHOD OF MANUFACTURING THE SAME', which claimed priority to Chinese Application No. CN 201110165241.8, filed on Jun. 20, 2011. Both the PCT Application and Chinese Application are incorporated herein by reference in their entireties.

FIELD OF THE INVENTION

The present invention relates to a semiconductor device and method of manufacturing the same, particularly to a semiconductor device, which takes a Ge film surrounded by a shallow trench isolation (STI) as the channel and a method of manufacturing the same.

BACKGROUND OF THE INVENTION

With continuous reductions in the sizes of semiconductor devices, enhancing the carrier mobility of the channel becomes very important. In the design of a stress layer of a substrate, different materials have different characteristics such as lattice constant, dielectric constant, forbidden gap, particularly carrier mobility, etc., as shown in Table 1 below.

TABLE 1

| Material | Lattice constant (nm) | Dielectric constant | Forbidden gap(eV) | Mobility ($cm^2$/V-s) electron | hole |
|---|---|---|---|---|---|
| Si | 0.5431 | 11.8 | 1.12 | 1600 | 430 |
| Ge | 0.5675 | 16 | 0.66 | 3900 | 1900 |
| GaAs | 0.5653 | 12.4 | 1.42 | 9200 | 400 |
| InAs | 0.6058 | 14.8 | 0.36 | 40000 | 500 |
| InSb | 0.648 | 17.7 | 0.17 | 77000 | 850 |

It can be seen from Table 1 that among the above-mentioned possible materials used as substrates, Ge has the highest hole mobility and a relatively higher electron mobility. Using Ge as the substrate of a semiconductor device will greatly enhance the carrier mobility, thus enabling manufacture of a higher-speed large scale integrated circuit (LSIC).

Further, it can also be seen from Table 1 that Ge has a lattice constant similar to that of the material Si so that Ge can be easily integrated on a Si substrate, which is commonly used in the semiconductor industry. Also by using Ge in the substrate, a semiconductor device with better performance can be manufactured having improved performance at a reduced cost without making huge improvements to the process.

In the design of a semiconductor device and an integrated circuit thereof, generally a shallow trench isolation (STI) is used to manufacture the insulating isolation among a plurality of devices in the substrate. The known method for manufacturing a STI comprises first etching a trench in the substrate, then depositing an insulating film made of e.g., an in the formed trench by a process such as chemical vapor deposition (CVD). With reduction in the device size, the aspect ratio of the corresponding STI becomes larger and the step coverage of the oxide insulating film becomes poorer, that is, the oxide insulating film on top of the narrower trench may join earlier than expected while the trench below has not been completely filled; thus holes or gaps may exist in the STI, resulting in device having impaired insulating property and worse reliability.

Overall, the existing semiconductor device with a Si channel surrounded by a STI has poor performance and reliability. In order to improve the electrical performance and reliability of the semiconductor device, the carrier mobility in the channel region shall be further improved and holes in the STI shall be eliminated

SUMMARY OF THE INVENTION

Therefore, a purpose of the present invention is to further improve the carrier mobility in a channel region and to eliminate holes in the STI, thereby improving the electrical performance and reliability of the semiconductor device.

The present invention discloses a semiconductor device, comprising: a substrate, an insulating isolation layer formed on the substrate, and an active region layer formed in the insulating isolation layer, wherein the of the active region layer is characterized by a higher carrier mobility compared to that of the substrate.

In the aforementioned semiconductor device, the substrate comprises silicon, the active region layer is formed by Ge which was epitaxially grown, and the insulating isolation layer is silicon oxide. A gate stack comprising a gate insulating layer and a gate material layer is formed on the active region layer, source/drain regions are formed in the active region layers on both sides of the gate stack, and source/drain contacts are formed on the source/drain regions. The gate material layer is formed of one material selected from a group of polysilicon, metal, and metal nitride, or combinations thereof. The gate insulating layer is formed of high K materials, and the gate insulating layer does not comprise the same oxides in the substrate nor in the active region layer. A liner layer lies between the substrate and the insulating isolation layer. The liner layer is formed of silicon nitride or silicon oxide.

The present invention also discloses a method for manufacturing a semiconductor device, comprising: forming an insulating isolation layer on a substrate; forming an insulating isolation layer trench in the insulating isolation layer; forming an active region layer in the insulating isolation layer trench; and forming a semiconductor device structure in and above the active region layer, wherein the active region layer has higher carrier mobility than that of the substrate.

In the aforementioned method, the substrate comprises silicon, and the active region layer is formed by Ge. In the method, a liner layer is further formed on the substrate after the formation of the insulating isolation layer. In the method, the liner layer is formed of silicon nitride or silicon oxide. In the method, the insulating isolation layer is formed by depositing silicon oxide on the substrate by a process of low pressure chemical vapor deposition (LPCVD), sub-atmospheric chemical vapor deposition (SACVD), or high density plasma chemical vapor deposition (HDPCVD). In the method, a mask pattern is formed on the insulating isolation layer, followed by etching the insulating isolation layer is using the mask pattern to form an insulating isolation layer trench to expose the substrate. The insulating isolation layer is over-etched down to the upper surface of the substrate. In the method, the mask pattern is formed by a photoresist or a hard mask layer. Ge is epitaxially deposited in the insulating isolation layer trench by a process of reduced pressure chemical vapor deposition (RPCVD), ultra-high vacuum chemical vapor deposition (UHVCVD) or molecular beam epitaxy (MBE). The epitaxial deposition is performed at temperature ranges from about 250° C. to 600° C. In said method, the semiconductor device structure comprises: a gate stack comprising the gate insulating layer and gate material layer deposited on the active region layer, source/drain regions formed by implanting ions into the active regions on both sides of the gate stack, and source/drain contacts deposited on the source/drain regions. The gate material layer in the semiconductor device, is formed by one of material selected from the group of polysilicon, metal, and metal nitride, or combinations thereof. In the semiconductor device, gate insulating layer is formed of high K materials, and the oxide in the substrate and/or nor the active region layer is absent between the gate insulating layer and the active region layer.

In accordance with the semiconductor device and the manufacturing method thereof in the present invention, an active region formed of a material different from that of the substrate is used, which provides enhanced carrier mobility in the channel region and substantially improved device response speed so that overall device performance is enhanced greatly. Furthermore, unlike the existing STI manufacturing process, in the present invention a STI is formed first, and then filling is performed to form an active region, thus avoiding the problem of generation of holes in the STI, and improving the device reliability.

The purposes of the present invention and other purposes not listed herein are satisfied in the independent claims of the present application. The embodiments of the present invention are defined in the independent claims, and the specific features are defined in the dependent claims.

BRIEF DESCRIPTION OF THE DRAWINGS

The technical solutions of the present invention are described in detail with reference to the drawings below.

DETAILED DESCRIPTION OF THE EMBODIMENTS

The features of the technical solutions of the present invention and the technical effects thereof are illustrated in detail in combination with the schematic embodiments with reference to the drawings, disclosed herein a semiconductor device in which the Ge channel is surrounded by a STI and the method of manufacturing the same. It should be pointed out that like reference signs indicate like structures, the terms such as “first”, “second”, “above”, “below” used in the present invention may be used to modify various device structures or process steps. Except for specific explanations, these modifications do not imply the spatial, sequential or hierarchical relationships of the structures of the modified device or the process steps.

Figure 1A:
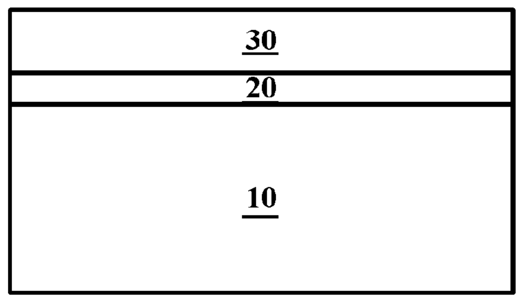
FIGS. 1A, 2A, 3A, 4A and 5A are respective diagrammatic cross-sections illustrations of the steps of the method for manufacturing the semiconductor device in accordance with the present invention.
Figure 1B:
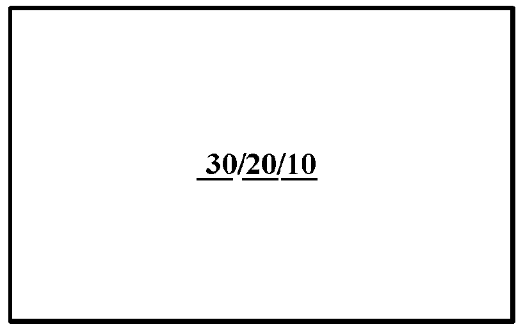
FIGS. 1B, 2B, 3B, 4B and 5B are respective top schematic diagrams to illustrate the steps of the method for manufacturing the semiconductor device in accordance with the present invention.

First, referring to FIGS. 1A and 1B, a liner layer and an insulating isolation layer are formed on the substrate. The substrate 10 may be common semiconductor silicon based substrates such as bulk Si and Si on insulator (SOI), bulk Ge and Ge on insulator (GeOI), compound semiconductor substrates such as SiGe, GaAs, and GaN, or insulating substrates such as sapphire, SiC, and MN. The substrate is selected based on the requirement of the electrical performance of the specific semiconductor device to be manufactured thereon. In the present invention, the semiconductor device as illustrated in the embodiment may be, for example, a field effect transistor (MOSFET), so in consideration of compatibility with other processes and cost, bulk silicon or SOI is preferred as the material for substrate 10. A liner layer 20 is deposited on the substrate 10 by a conventional process such as CVD, and the material of the layer may be oxide, nitride, or oxynitride, specifically, such as silicon nitride ($Si_3N_4$ or $SiN_x$, where x is 1~2) or silicon oxide (SiO or $SiO_2$). The liner layer 20 is used as a stop layer for the subsequent etch to protect the substrate 10, and the thickness thereof is set depending on the requirement of the etching process. Then, an insulating isolation layer 30, formed of a material such as silicon oxide, particularly silicon dioxide, may be deposited on the liner layer 20 by a process such as low pressure chemical vapor deposition (LPCVD), sub-atmospheric chemical vapor deposition (SACVD), high density plasma chemical vapor deposition (HDPCVD), and an appropriate pressure and temperature shall be selected to control the uniformity, step coverage and deposition speed. The insulating isolation layer 30 is used as the insulating isolation among a plurality of semiconductor devices on the substrate 10, that is, the traditional STI filler, and the thickness thereof is set depending on the requirement of insulating isolation. It should be noted that in the cross-section of FIG. 1A and the top view of FIG. 1B, the substrate 10, the liner layer 20 and the insulating isolation layer 30 have substantially the same areas, in actual production process, the above basic structure can be formed only around the center of the active region or wafer in accordance with the layout, the following steps are similar.

Figure 2A:
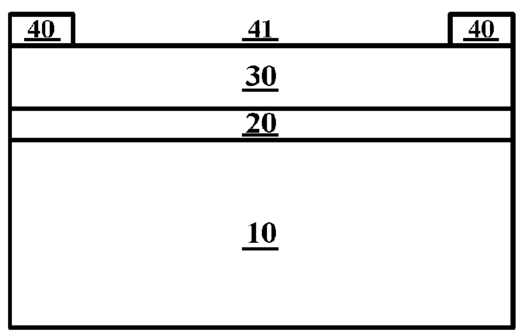
Figure 2B:
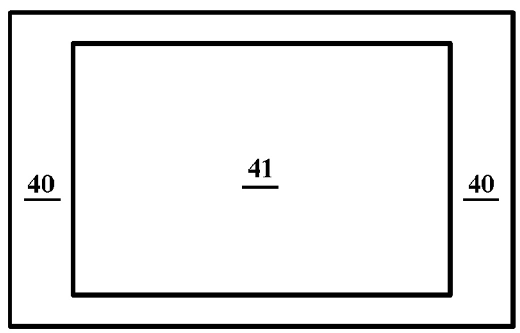

Second, referring to FIGS. 2A and 2B, a mask pattern is formed on the insulating isolation layer. A mask layer is formed on the insulating isolation layer 30 and is patterned to form a mask pattern 40. The mask layer may be photoresist coated on the insulating isolation layer 30 by a process such as spin coating, then a mask pattern 40 of the photoresist is formed by photolithographic steps including exposing and developing etc. The mask layer may also be a hard mask layer such as silicon nitride, in such a case, a hard mask pattern 40 is formed by etching after a soft mask of photoresist is formed thereon. As shown in FIG. 2B, the mask pattern 40 is complementary to the active region to be formed, that is, the active region is surrounded by the mask pattern while a mask pattern opening 41 exposing the insulating isolation layer 30 is left, the part of the insulating isolation layer 30 underneath the mask pattern 40 is used to form a STI later, thus the width of the mask pattern 40 is set based on the requirement of the width of the STI.

Figure 3A:
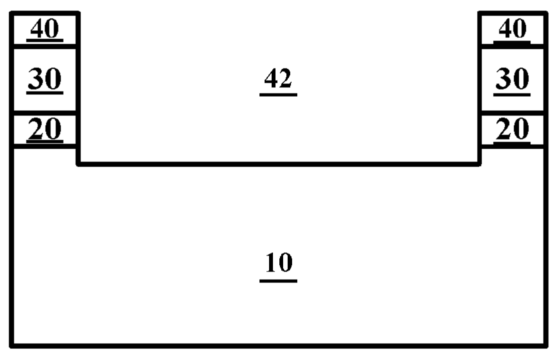
Figure 3B:
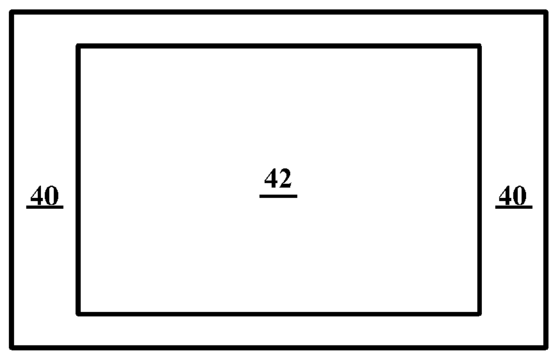

Then, referring to FIGS. 3A and 3B, an insulating isolation layer trench is formed by etching with the mask pattern as a mask. After the mask pattern 40 and the mask pattern opening 41 are formed, a part of insulating isolation layer 30 and the liner layer 20 exposed in the mask pattern opening 41 are etched to form an insulating isolation layer trench 42. The remaining part left in the insulating isolation layer is used as the insulating isolation structure of the device, that is, equivalent to the STI in the prior art. When the insulating isolation layer 30 is formed of silicon oxide, wet etching by using dilute hydrofluoric acid, or dry etching by using fluorocarbon-based, $SF_6$-based or $NF_3$-based plasma (which may also be doped with $O_2$, HBr, $CL_2$ etc.) may be performed to expose the substrate 10. Slight over-etching may also be performed, for example, over-etching to a depth of about 1~10 nm into the substrate 10 to rough the upper surface thereof, which is helpful for forming the Ge film later.

Figure 4A:
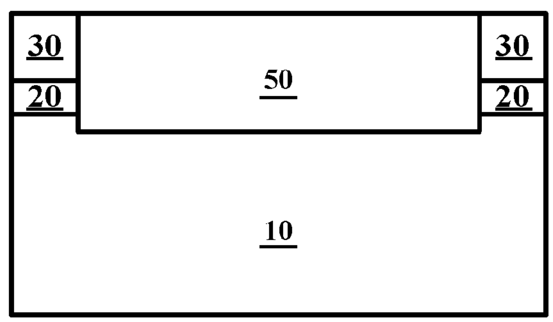
Figure 4B:
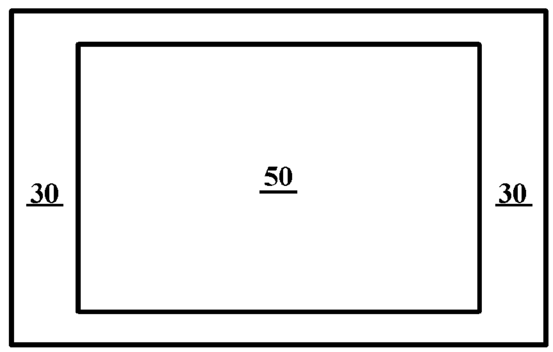

Next, referring to FIGS. 4A and 4B, an active region layer is formed in the insulating isolation layer trench. After the insulating isolation layer trench 42 is formed, the mask pattern 40 is removed, and the surface of the exposed substrate 10 is wet cleaned such that subsequent epitaxial growth will not be affected by impurities. When the mask pattern 40 is formed of a photoresist, the mask pattern 40 of the photoresist may either be removed by an organic solvent such as acetone and/or aromatic solvents or an inorganic solvent consisting of sulfuric acid and hydrogen peroxide, or be removed by dry etching using oxygen plasma. When the mask pattern 40 is formed of silicon nitride, the mask pattern 40 may be removed by using hot phosphoric acid. As for substrate 10, it may be wet cleaned, and the cleaning agent may include ammonia water, hydrogen peroxide, deionized water, dilute hydrochloric acid, dilute sulphuric acid, dilute hydrofluoric acid, dilute hydrogen nitrate, choline, Caro's acid, and ozonated water etc., or combinations thereof. Next, after the surface moisture and carbon impurities are removed by high temperature baking, an active region layer 50 is epitaxially deposited in the insulating isolation layer trench 42, and the layer is made of a material different from that of the substrate 10 and has a carrier mobility higher than that of the substrate 10. In the embodiment of the present invention, the active region layer 50 is formed by Ge material, preferably pure Ge film, besides the material may also be selected from GaAs, InAs, InSb and SiGe, in accordance with Table 1. The epitaxial deposition may be performed by a process such as reduced pressure chemical vapor deposition (RPCVD), ultra-high vacuum chemical vapor deposition (UHVCVD) or molecular beam epitaxy (MBE), etc. Preferably, the deposition is a low temperature deposition, with a temperature range from about 250° C. to 600° C. Gases such as HCl may be mixed in the feed gas to improve the selectivity of the epitaxy, that is, enabling the active region layer to be deposited within the insulating isolation trench 42, instead of being deposited on the insulating isolation layer 30. When the active region layer 50 is formed by epitaxial deposition, redundant material for the active region layer is removed by chemical mechanical polishing (CMP) and/or wet cleaning to control the morphology of the active region layer 50, that is, removing the part that is higher than the insulating isolation layer 30.

Figure 5A:
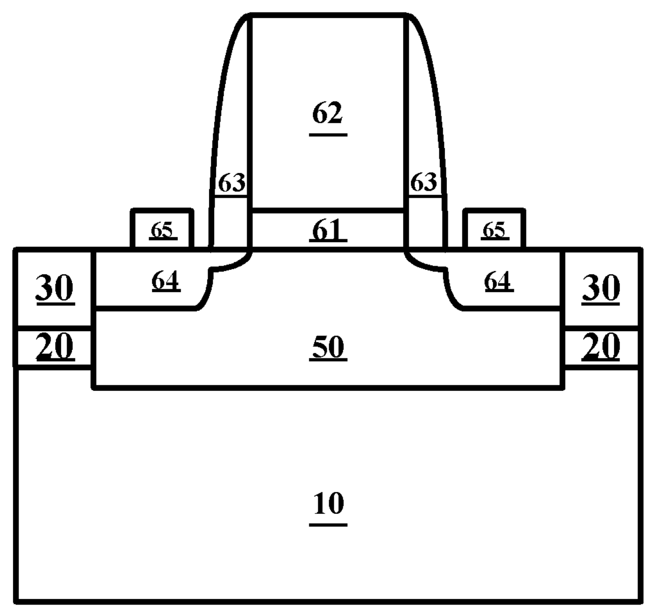
Figure 5B:
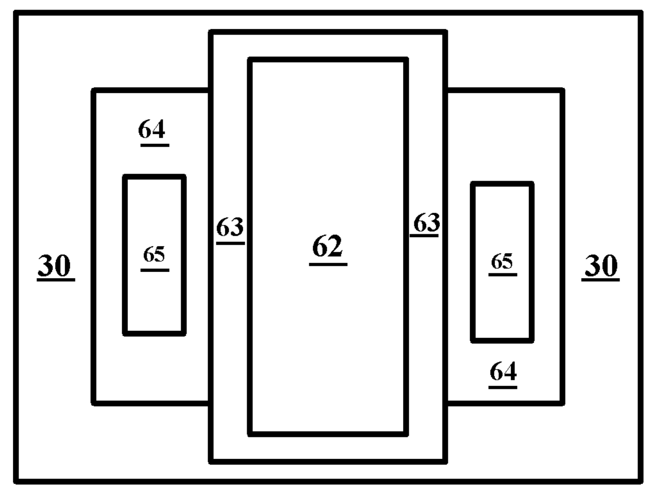

Last, referring to FIGS. 5A and 5B, a device structure is formed in the active region. In the embodiment of the present invention, MOSFET is taken as an example, first, a gate insulating layer 61 and a gate material layer 62, and a cap layer such as silicon nitride (not shown) are sequentially deposited on the active region layer 50; second, photolithography/etching is performed to form a gate stack structure, and a first ion implantation is performed with the cap layer on the top of the gate stack structure as a mask to form a low doped source/drain region in the active region 50, the type of doping being different depending on the type of PMOS/NMOS; then deposition and etching are performed on both sides of the gate to form gate isolation spacers 63; a second ion implantation is performed with the gate isolation spacers 63 as a mask to form a heavily doped source/drain region in the active region 50, finally source/drain regions 64 are formed as the heavily doped regions having lightly doped source/drain structure (LDD), with a channel region of the device being located between the source/drain regions 64; and source/drain contacts 65 are formed on the source/drain regions 64.

The finally formed device structure is as shown in FIG. 5A, a gate insulating layer 30 is formed on the substrate 10. In the gate insulating layer an active region layer 50 is formed, wherein the carrier mobility of the active region layer 50 is higher than that of the substrate 10. A semiconductor device structure is formed in and above the active region layer 50, the semiconductor device comprises source/drain regions 64 of the device in the active region layer 50, a gate insulating layer 61, a gate material layer 62, and gate isolation spacers 63 above the active region layer 50, and source/drain contacts 65 above the source/drain regions 64. Preferably, the material for the gate insulating layer 61 is one or more high K materials (e.g., the dielectric constant K is greater than 3.9), for example, nitride such as SiN, MN, and AlHfN, metal oxide such as $Al_2O_3$, $Ta_2O_5$, $TiO_2$, ZnO, $ZrO_2$, $HfO_2$, $CeO_2$, and $Y_2O_3$, and perovskite phase oxide such as PZT($PbZr_xTi_{1-x}O_3$) and BST($Ba_xSr_{1-x}TiO_3$), or combinations of all these materials, such as a stack or a mixture. It should be noted that no oxide of the substrate 10 nor the active region layer 50, i.e., silicon oxide and/or germanium oxide, lies between the gate insulating layer 61 and the Ge in the active region, that is, a Zero Interface to improve the performance of a high K material. The material for the gate material layer 62 may be polysilicon, metals such as Al, Au, W, Ta, and $Ti_1$ and the nitrides of these metals, or combinations of polysilicon, metals, and metal nitrides, such as a stack or a mixture. Wherein the polysilicon may be doped or metal materials with an appropriate work function may be selected to control the threshold voltage of the device. The material for the source/drain contacts 65 may either be metals such as Al, Au, W, Ta, and Ti, or metal nitrides, or metal silicides such as NiSi and WSi to further decrease the contact resistance and the series resistance of the source/drain.

Although the semiconductor device structure illustrated in the embodiment of the present invention is a MOSFET which takes Ge film on the silicon substrate as the active region and channel region, the present invention may also be applicable to other semiconductor devices such as bipolar transistors, MESFETs, HEMTs, and diodes which take other materials as the active region or substrate, so long as the device structure and the manufacturing method thereof comprise the active region the carrier mobility thereof is higher than that of the substrate and the insulating isolation layer surrounding the active region in the present invention. Furthermore, although the embodiment of the present invention only gives an example where Ge material is used by the PMOS active region, Group III-IV compound such as GaAs and GaN may also be used as the active region for other devices such as NMOS.

In accordance with the semiconductor device and the manufacturing method thereof in the present invention, an active region formed of a material different from that of the substrate is used, the carrier mobility in the channel region is enhanced, thereby the device response speed is substantially improved and the device performance is enhanced greatly. Furthermore, unlike the existing STI manufacturing process, in the present invention a STI is formed first, and then filling is performed to form an active region to avoid the problem of generation of holes in the STI and yield a device with improved reliability.

Although the present invention has been described with reference to one or more illustrative embodiments, it may be appreciated by those skilled in the art that various appropriate modifications and equivalents can be made to the process flow without departing from the scope of the present invention. Besides, many modifications adaptable to specific situations or materials can be made under the disclosed teaching without departing from the scope of the present invention. Therefore, the present invention does not aim to define the specific embodiments which are disclosed as the preferred embodiments for implementing the present invention, the disclosed device structure and the manufacturing method thereof will include all the embodiments that come within the scope of the present invention.

What is claimed is:

1. A method for manufacturing a semiconductor device, comprising:

forming an insulating isolation layer on a substrate;

forming an insulating isolation layer trench in the insulating isolation layer;

forming an active region layer in the insulating isolation layer trench; and forming a semiconductor device structure in and above the active region layer;

characterized in that the carrier mobility of the active region layer is higher than that of the substrate.

2. The method for manufacturing a semiconductor device according to claim 1, wherein the substrate is formed of silicon, and the active region layer is formed of Ge.

3. The method for manufacturing a semiconductor device according to claim 1, wherein a liner layer is further formed on the substrate after the insulating isolation layer is formed.

4. The method for manufacturing a semiconductor device according to claim 3, wherein the liner layer is formed of silicon nitride or silicon oxide.

5. The method for manufacturing a semiconductor device according to claim 1, wherein the insulating isolation layer is formed by depositing silicon oxide on the substrate by a process of HDP, LPCVD, or SACVD.

6. The method for manufacturing a semiconductor device according to claim 1, wherein a mask pattern is formed on the insulating isolation layer, then the insulating isolation layer is etched by taking the mask pattern as a mask to form the insulating isolation layer trench to expose the substrate.

7. The method for manufacturing a semiconductor device according to claim 6, wherein the insulating isolation layer is over-etched down to the upper surface of the substrate.

8. The method for manufacturing a semiconductor device according to claim 6, wherein the mask pattern is formed of photoresist or a hard mask layer.

9. The method for manufacturing a semiconductor device according to claim 1, wherein Ge is epitaxially deposited in the insulating isolation layer trench by a process of RPCVD, UHVCVD or MBE.

10. The method for manufacturing a semiconductor device according to claim 9, wherein the epitaxial deposition is performed at a temperature ranging from about 250° C. to 600° C.

11. The method for manufacturing a semiconductor device according to claim 1, wherein the semiconductor device structure comprising: a gate stack constituted by the gate insulating layer and gate material layer deposited on the active region layer, source/drain regions formed by implanting ions into the active regions on both sides of the gate stack, and source/drain contacts deposited on the source/drain region.

12. The method for manufacturing a semiconductor device according to claim 11, wherein the gate material layer is formed of one of polysilicon, metal, metal nitride and/or the combinations thereof.

13. The method for manufacturing a semiconductor device according to claim 11, wherein the gate insulating layer is formed of high K materials, and no oxide of the substrate and/or the active region layer is comprised between the gate insulating layer and the active region layer.

* * * * *